United States Patent
Iwabuchi et al.

(10) Patent No.: US 6,870,167 B2
(45) Date of Patent: Mar. 22, 2005

(54) PREPARATION OF RADIATION IMAGE STORAGE PANEL

(75) Inventors: Yasuo Iwabuchi, Ashigara-kami-gun (JP); Makoto Kashiwaya, Odawara (JP); Atsunori Takasu, Ashigara-kami-gun (JP); Yuichi Hosoi, Ashigara-kami-gun (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 94 days.

(21) Appl. No.: 10/212,042

(22) Filed: Aug. 6, 2002

(65) Prior Publication Data

US 2003/0047697 A1 Mar. 13, 2003

(30) Foreign Application Priority Data

Aug. 6, 2001  (JP) ........................................ 2001-238339

(51) Int. Cl.$^7$ .............................................. G03B 42/08
(52) U.S. Cl. ..................................................... 250/484.4
(58) Field of Search ....................................... 250/484.4

(56) References Cited

U.S. PATENT DOCUMENTS

| | | | | |
|---|---|---|---|---|
| 4,767,927 A | * | 8/1988 | Ohyama et al. | 250/585 |
| 4,769,549 A | * | 9/1988 | Tsuchino et al. | 250/484.4 |
| 4,947,046 A | * | 8/1990 | Kawabata et al. | 250/484.4 |
| 5,055,681 A | * | 10/1991 | Tsuchino et al. | 250/484.4 |
| 5,796,113 A | * | 8/1998 | Nagli et al. | 250/483.1 |

FOREIGN PATENT DOCUMENTS

JP        2000-330228 A    * 11/2000    ........... G03B/42/02

* cited by examiner

Primary Examiner—Constantine Hannaher
(74) Attorney, Agent, or Firm—Sughrue Mion, PLLC

(57) ABSTRACT

A radiation image storage panel having a phosphor layer which is composed of a phosphor having a matrix component and an activator component is prepared by the steps of forming on a substrate a lower prismatic crystalline layer composed of the matrix component by vapor deposition; and forming on the lower prismatic crystalline layer an upper prismatic crystalline layer composed of the matrix component and the activator component by vapor deposition.

8 Claims, 5 Drawing Sheets

PREPARATION OF RADIATION IMAGE STORAGE PANEL

FIELD OF THE INVENTION

The invention relates to a process for preparing a radiation image storage panel favorably employable in a radiation image recording and reproducing method utilizing stimulated emission of a stimulable phosphor.

BACKGROUND OF THE INVENTION

When the stimulable phosphor is exposed to radiation such as X-rays, it absorbs and stores a portion of the radiation. The stimulable phosphor then emits stimulated emission according to the level of the stored energy when the phosphor is exposed to electromagnetic wave such as visible light or infrared rays (i.e., stimulating light).

A radiation image recording and reproducing method utilizing the stimulable phosphor has been widely employed in practice. The method employs a radiation image storage panel comprising the stimulable phosphor, and comprises the steps of causing the stimulable phosphor of the storage panel to absorb radiation energy having passed through an object or having radiated from an object; sequentially exciting the stimulable phosphor with a stimulating light to emit stimulated light; and photoelectrically detecting the emitted light to obtain electric signals giving a visible radiation image. The storage panel thus treated is subjected to a step for erasing radiation energy remaining therein, and then stored for the use in the next recording and reproducing procedure. Thus, the radiation image storage panel can be repeatedly used.

The radiation image storage panel (often referred to as stimulable phosphor sheet) has a basic structure comprising a substrate and a stimulable phosphor layer provided thereon.

The phosphor layer is generally formed by coating a dispersion of phosphor particles in a binder solution on the substrate and drying the coated dispersion on the substrate, and therefore comprises a binder and phosphor particles dispersed therein.

It is desired that radiation image storage panels used in these methods have sensitivity as high as possible and further can give a reproduced radiation image of high quality (in regard of sharpness and graininess).

It is known that a radiation image storage panel having on a substrate a stimulable phosphor film prepared by vapor deposition (or vapor-accumulating method) such as vacuum vapor deposition or sputtering gives a reproduced radiation image with high sensitivity as well as high sharpness.

Japanese Patent Provisional Publication No. 62-47600 discloses a method in which a stimulable phosphor film of a radiation image storage panel is formed by electron beam evaporation (which is a kind of vapor deposition method). In the method, an electron beam generated by an electron gun is applied onto a stimulable phosphor or its starting materials (i.e., evaporation source) to heat and vaporize the source, to deposit the vapor to form a phosphor film on the surface of the substrate. Thus formed phosphor film consists essentially of prismatic crystals of the stimulable phosphor. In the phosphor film, there are cracks between the prismatic crystals of the stimulable phosphor. For this reason, the stimulating rays are efficiently applied to the phosphor and the stimulated emission are also efficiently taken out. Hence, a radiation image of high sharpness can be obtained with high sensitivity.

Japanese Patent Publication No. 6-77079 describes a radiation image storage panel in which a stimulable phosphor film is formed by vapor deposition to have a fine block structure.

Japanese Patent Provisional Publication No.61-245099 describes a structure of the vapor deposited stimulable phosphor layer formed on a substrate. The phosphor layer comprises a great number of prismatic phosphor crystals arranged on the substrate in the form of islands, and spaces or slits which divide the phosphor layer into the islands each comprising phosphor material. Accordingly, each prismatic phosphor island is optically separated from the adjoining prismatic phosphor islands. The surface of the substrate can be etched by patterning. Otherwise, granular phosphor particles are dispersed on the substrate by depositing a vapor of stimulable phosphor or alkali halide crystals.

SUMMARY OF THE INVENTION

According to the study of the present inventors on the preparation of a phosphor layer by vapor deposition, it has been noted that simple vapor deposition of the phosphor material or simultaneous vapor deposition of a mixture of starting materials for the phosphor may sometimes produce a deposited phosphor layer having deformed prismatic phosphor crystals, particularly in the case of preparing a phosphor layer of CsBr:Eu by vapor deposition. It is considered that the incorporation of divalent or trivalent Eu into a phosphor matrix structure composed of monovalent metal compound causes deformation of the prismatic phosphor crystalline structure.

Accordingly, the present invention has an object to provide a process for preparing a radiation image storage panel which has a phosphor layer comprising prismatic crystals of good shape.

From a different aspect, the invention has an object to provide a radiation image storage panel which can give a reproduced radiation image of high quality.

The present inventors have found that a phosphor layer composed of a prismatic crystalline structure of good shape can be produced by first forming a layer of a prismatic phosphor matrix component crystals on a substrate by vapor deposition and then growing each of prismatic phosphor matrix component crystals by depositing on each crystal a mixture of a phosphor matrix component and an activator component by vapor deposition, simultaneously.

It has been further noted that the conditions of phosphor crystal faces are well controlled by the above-mentioned method.

The present invention resides in a process for the preparation of a radiation image storage panel having a phosphor layer which comprises a phosphor comprising a matrix component and an activator component, which comprises the steps of:

forming on a substrate a lower prismatic crystalline layer comprising the matrix component by vapor deposition; and forming on the lower prismatic crystalline layer an upper prismatic crystalline layer comprising the matrix component and the activator component by vapor deposition.

The substrate employed in the above-mentioned vapor deposition process can be employed as a support of the radiation image storage panel. If desired, the substrate can be replaced with a support of other material.

Further, the invention resides in a radiation image storage panel having a phosphor layer which comprises a phosphor comprising a matrix component and an activator component, wherein both of a concentration of the activator component in a portion of from the bottom surface to depth of 99/100 and a concentration of the activator component in a portion of from the upper surface to depth of 1/100 satisfy the condition of $0 \leq p/q < 1$ (preferably $0 \leq p/q < 0.1$), wherein p stands for the concentration in the portion of from the bottom surface to depth of 99/100, and q stands for the concentration in the portion of from the upper surface to depth of 1/100.

Furthermore, the invention resides in a process for reading radiation image information comprising steps of:

moving in one direction the radiation image storage panel of the invention on which radiation image information is recorded and stored, in relation to a line sensor which comprises plural photoelectric converting elements arranged linearly and which is placed over the surface of the phosphor layer of the storage panel, under such condition that the line sensor moves on a plane parallel to the storage panel, while the phosphor layer of the storage panel is scanned with stimulating rays in a direction which is different from the direction of the movement of the storage panel;

detecting an emission emitting from the phosphor layer of the storage panel by the line sensor, so as to photoelectrically convert the emission to an electric signal;

detecting an electric signal of the movement of the storage panel in relation to the line sensor; and comparing the signal of the emission and the signal of the movement of the storage panel to produce a radiation image information in the form of electric signals.

BRIEF DESCRIPTION OF DRAWINGS

Each of FIG. 1-(a) and FIG. 1-(b) shows a schematic sectional view showing constitution of a radiation image storage panel of the invention.

DETAILED DESCRIPTION OF THE INVENTION

Figure 1:
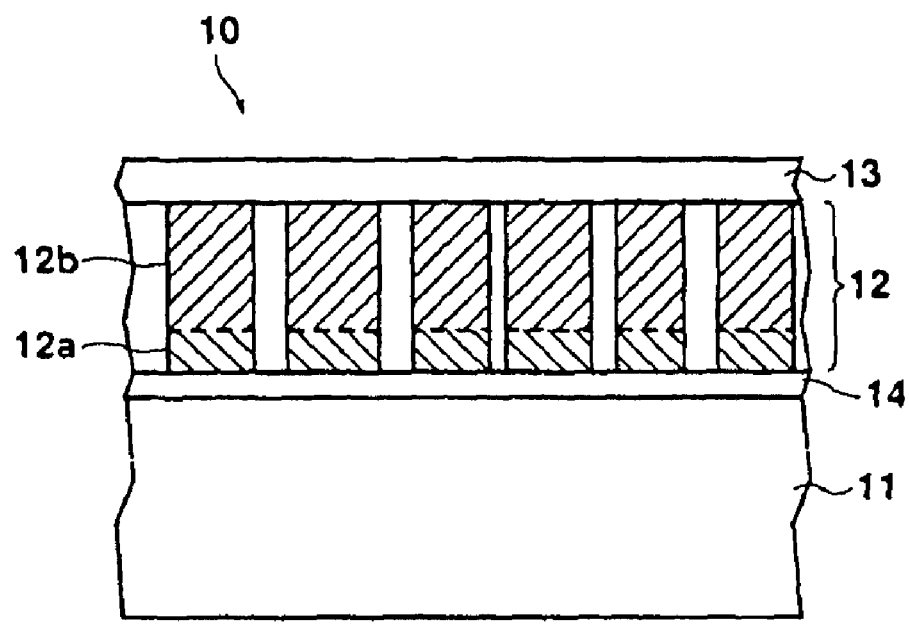
Figure 1:
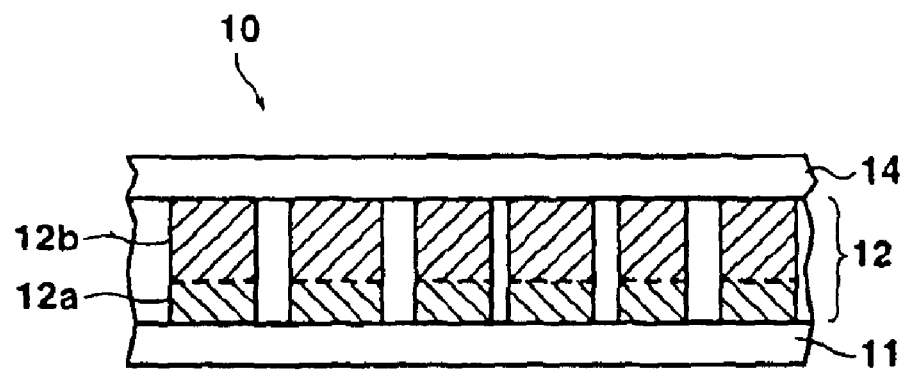

In the invention, both vapor deposition methods are preferably performed by electron beam evaporation. The ratio of thickness between the lower prismatic crystalline layer and the upper prismatic crystalline layer preferably is in the range of 1:100 to 1:1 (in terms of thickness of the lower layer:thickness of the upper layer).

In the preparation process of the invention, it is preferred that the formed lower prismatic crystalline layer and formed upper prismatic crystalline layer are simultaneously subjected to heat treatment. The phosphor preferably is a stimulable phosphor.

The stimulable phosphor preferably is an alkali metal halide phosphor having the formula (I):

$$M^I X \cdot x M^{II} X'_2 \cdot y M^{III} X''_3 : zA \qquad (I)$$

in which $M^I$ is at least one alkali metal element selected from the group consisting of Li, Na, K, Rb and Cs; $M^{II}$ is at least one alkaline earth metal element or divalent metal element selected from the group consisting of Be, Mg, Ca, Sr, Ba, Ni, Cu, Zn and Cd; $M^{III}$ is at least one rare earth element or trivalent metal element selected from the group consisting of Sc, Y, La, Ce, Pr, Nd, Pm, Sm, Eu, Gd, Tb, fly, Ho, Er, Tin, Yb, Lu, Al, Ga and In; each of X, X' and X" independently is at least one halogen selected from the group consisting of F, Cl, Br and I; A is at least one rare earth element or metal element selected from the group consisting of Y, Ce, Pr, Nd, Sm, Eu, Gd, Th, Dy, Ho, Er, Tl, Yb, Lu, Na, Mg, Cu, Ag, Tl and Bi; and x, y and z are numbers satisfying the conditions of $0 \leq x < 0.5$, $0 \leq y < 0.5$ and $0 < z \leq 0.2$, respectively.

In the formula (I), it is preferred that A is Eu, $M^I$ is Cs, and X is Br.

The preparation of a radiation image storage panel of the invention is described below.

The vaporization of the evaporation source and deposition of the produced vapor can be performed in a vacuum evaporation apparatus comprising a vacuum chamber equipped with a vacuum pump, a supporting plate for evaporation source, heating means, and a supporting means for a substrate on which the vapor is to be deposited.

For performing the vacuum evaporation, the evaporation source is placed directly on the supporting plate or placed in a crucible or dish which is then placed on the supporting plate. A number of evaporation sources can be employed in the vacuum evaporation. The substrate is attached to the supporting means in the position over the evaporation sources.

The substrate preferably are sheets of quartz glass, sapphire, metals (e.g., aluminum, iron, tin, chromium) or heat-resistant resins (e.g., aramide). On the substrate can be placed a light reflecting layer such as a layer containing a titanium dioxide or a light absorbing layer such as a layer containing carbon black.

On the substrate, a phosphor film is deposited. The phosphor film is preferably formed by electron beam deposition which employs electron beam to heat the evaporation source. The electron beam evaporation generally gives regularly aligned prismatic crystals having good shape.

The phosphor preferably is a stimulable phosphor which emits a stimulated emission having a wavelength of 300 to 500 nm when it is irradiated with a stimulating light having a wavelength of 400 to 900 nm.

Preferred is an alkali metal halide phosphor having the formula (I)

$$M^I X \cdot x M^{II} X'_2 \cdot y M^{III} X''_3 : zA \qquad (I)$$

in which $M^I$ is at least one alkali metal element selected from the group consisting of Li, Na, K, Rb and Cs; $M^{II}$ is at least one alkaline earth metal element or divalent metal element selected from the group consisting of Se, Mg, Ca, Sr, Ba, Ni, Cu, Zn and Cd; $M^{III}$ is at least one rare earth element or trivalent metal element selected from the group consisting of Sc, Y, La, Ce, Pr, Nd, Pm, Sm, Eu, Gd, Th, Dy, Ho, Er, Tm, Yb, Lu, Al, Ga and Tn; each of X, X' and X" independently is at least one halogen selected from the group consisting of F, Cl, Br and I; A is at least one rare earth element or metal element selected from the group consisting of Y, Ce, Pr, Nd, Sm, Eu, Gd, Tb, Dy, Ho, Er, Tm, Yb, Lu, Na, Xg, Cu, Ag, Ti and Bi; and x, y and z are numbers satisfying the conditions of $0 \leq x < 0.5$, $0 \leq y < 0.5$ and $0 < z \leq 0.2$, respectively.

In the formula (I), at least Cs is preferably included as $M^I$, at least Br is preferably included as X, and A is particularly preferably Eu or Bi. The phosphor of the formula (I) may contain a metal oxide (such as aluminum oxide, silicon dioxide or zirconium oxide) as an additives in an amount of not more than 0.5 mol based on 1 mol of $M^I$.

Another preferred stimulable phosphor is a rare earth activated alkaline earth metal fluoride-halide phosphor having the following formula (II):

$$M^{II}FX:zLn \qquad (II)$$

in which $M^{II}$ is at least one alkaline earth metal element selected from the group consisting of Ba, Sr and Ca; Ln is at least one rare earth element selected from the group consisting of Ce, Pr, Sm. Eu, Th, Dy, Ho, Nd, Er, Tm and Yb; X is at least one halogen selected from the group consisting of Cl, Br and I; and z is a number satisfying the condition of $0 < z \leq 0.2$.

In the formula (II), Ba is preferably included in an amount of half or more of $M^{II}$, and Ln particularly preferably is Eu or Ce. The $M^{II}FX$ in the formula (II) indicates the crystal structure of BaFX, and it by no means indicates F:X=1:1. The formula (II), therefore, does not indicate resultant stoichiometric composition. It is generally preferred to produce many $F^+(X^-)$ centers (which are vacant lattice points of $X^-$ ion) in a BaFX crystal, so as to enhance the efficiency of emission stimulated by light in the wavelength region of 600 to 700 nm. In many cases, F is in slight excess of X.

One or more of the following additives may be added into the phosphor of the formula (II), if needed, although they are omitted in the formula (II):

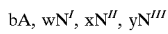

$$bA, wN^I, xN^{II}, yN^{III}$$

In the above formula, A is a metal oxide such as $Al_2O_3$, $SiO_2$ or $ZrO_2$. For preventing $M^{II}FX$ particles from sintering, A is preferably inactive to $M^{II}FX$ and is preferably in the form of fine particles (the mean size of primary particles is not more than 0.1 μm). $N^I$ is a compound of at least one alkali metal element selected from the group consisting of Li, Na, K, Rb and Cs; $N^{II}$ is a compound of alkaline earth metal element Mg and/or Be; and $N^{III}$ is a compound of at least one trivalent metal element selected from the group consisting of Al, Ga, In, Tl, Sc, Y, La, Gd and Lu.

The letters b, w, x and y represent added amounts of the additives, based on 1 mol of $M^{II}Fx$ when the additives are added into the phosphor. They satisfy the conditions of $0 \leq b \leq 0.5$, $0 \leq w \leq 2$, $0 \leq x \leq 0.3$ and $0 \leq y \leq 0.3$. The amounts of the additives often decrease during sintering and washing processes, and hence the b, w, x and y do not always indicate the ratios of the components in the resultant phosphor. Some of the additives are not changed to remain in the resultant phosphor, but others are reacted with or incorporated in $M^{II}FX$.

Further, other additives can be added to the phosphor of the formula (II), if needed. Examples of the additives include Zn and Cd compounds; metal oxides such as $TiO_2$, BeO, MgO, CaO, SrO, BaO, ZnO, $Y_2O_3$, $La_2O_3$, $In_2O_3$, $GeO_2$, $SnO_2$, $Nb_2O_5$, $Ta_2O_5$ and $ThO_2$; Zr and Sc compounds; B compounds; As and Si compounds; tetrafluoroborates; hexafluoro compounds (monovalent or divalent salts of hexafluorosilicate, hexafluorotitanate and hexafluorozirconate); and compounds of transition metal such as V, Cr, Mn, Fe, Co and Ni. Furthermore, whether the above additives are incorporated or not, any rare earth activated alkaline earth metal fluorohalide stimulable phosphor can be used in the invention.

The phosphor used in the invention is not restricted to a stimulable phosphor. A phosphor giving a spontaneous emission in the ultraviolet or visible wavelength region when it absorbs a radiation such as X-ray can be also employed in the invention. Examples of these phosphors include $LnTaO_4$:(Nb,Gd), $Ln_2SiO_5$:Ce, LnOX:Tm (where Ln is a rare earth element), CsX (where X is a halogen), $Gd_2O_2S$:Tb, $Gd_2O_2S$:Pr, Ce, $ZnWO_4$, $LuAlO_3$:Ce, $Gd_3Ga_5O_{12}$:Cr, Ce and $HfO_2$.

In the case that the phosphor of the formula (I) contains an europium activator, the europium compound of the evaporation source preferably comprise a divalent europium ($Eu^{2+}$) compound and a trivalent ($Eu^{3+}$) compound. It is preferred that the europium compound contains the divalent europium compound as much as possible, at least 70%.

The evaporation source preferably is in the form of a tablet having a water content of not more than 0.5 weight %. The water content can be determined by thermo-gravimetric analysis in which the weight loss in the temperature range of 50 to 150° C. is measured.

Moreover, the evaporation source preferably has a relative density of 80% or more. The relative density means a value obtained by dividing a density of the evaporation source by the inherent density of the corresponding material. The evaporation source of a high relative density can be evaporated uniformly and then is effective to produce a deposited phosphor film (or layer) of a uniform thickness.

For the preparation of the phosphor film on a substrate, it is preferred to employ two or more evaporation sources such as a combination of an evaporation source (such as in the form of tablet) comprising a matrix component and an evaporation source (such as in the form of tablet) comprising an activator component. Plural evaporation sources comprising a matrix component can be employed in the vaporization procedure. Plural evaporation sources comprising an activator component and a matrix component can be employed in the vaporization procedure.

In the process of the invention, an evaporation source or evaporation sources comprising a matrix component and a substrate on which the phosphor film is to be deposited are first set in a vacuum evaporation apparatus. The substrate is placed perpendicularly to the direction in which the vapor comes out of the source. The apparatus is then evacuated to give an inner pressure of $1 \times 10^{-5}$ to $1 \times 10^{-2}$ Pa. An inert gas such as Ar gas or Ne gas may be incorporated into the apparatus.

It is preferred that the evaporation procedure (that is, a combination of production and deposition of vapor) are performed in the vacuum chamber at a partial pressure of water of $7.0 \times 10^{-3}$ Pa or lower. It is also preferred that the evaporation procedure (that is, a combination of production and deposition of vapor) are performed in the vacuum chamber at a partial pressure of hydrocarbon of $1.0 \times 10^{-6}$ Pa or lower. The partial pressure of hydrocarbon is a value in terms of hydrocarbon of amu=55. The reduction of a partial pressure of water and the reduction of a partial pressure of hydrocarbon can be accomplished simultaneously.

In the vacuum evaporation apparatus, an electron beam generated by an electron gun is applied onto the evaporation source. The accelerating voltage of electron beam preferably is in the range of 1.5 kV to 5.0 kV. By applying the electron beam, the evaporation source of matrix component is heated, vaporized, and deposited on the substrate. The deposition rate of the matrix component generally is in the range of 0.1 to 1,000 μm/min., preferably in the range of 1 to 100

μm/min. The substrate may be cooled or heated, if needed, during the deposition process.

In the above-described vapor deposition procedure, a thin layer of well aligned prismatic crystals of matrix component is formed on the substrate. In the layer, the prismatic crystals are aligned with a space (crack) separating the adjoining prismatic crystals.

Subsequently, one or more evaporation sources of phosphor material are set in the evaporation apparatus. The evaporation sources can be replaced with a combinations of one or more evaporation sources of the matrix component and one or more evaporation sources of the activator component.

To the newly set evaporation sources is applied an electron beam in the same manner as that described above, to form, on the previously formed prismatic crystalline layer of the matrix component, a prismatic phosphor crystalline layer. In the-vapor deposition, the prismatic phosphor crystals grow on the lower prismatic crystals of matrix component to give well-shaped prismatic phosphor crystals.

After the procedures for forming the matrix component layer and for forming the phosphor layer on the matrix component layer are complete, the resulting composite layer can be subjected to heat treatment (annealing treatment).

By the above-described vapor deposition procedures, a phosphor film (or layer) comprising a lower thin prismatic matrix component layer and an upper prismatic phosphor layer (Which is illustrated in FIG. 1) is produced on the substrate. The phosphor film preferably has a thickness of 50 to 1,000 μm, more preferably 200 to 700 μm.

The phosphor film in which the prismatic stimulable phosphor crystals are aligned almost perpendicularly to the substrate is formed. Thus formed phosphor film comprises only the stimulable phosphor with no binder, and there are produced cracks extending the depth direction in the phosphor film.

FIG. 1-(a) schematically illustrates a section of a portion of a radiation image storage panel prepared by the process of the invention. In FIG. 1-(a), the radiation image storage panel 10 is composed of a support 11, a phosphor layer 12, and a protective layer 13. A light-reflecting layer 14 is placed between the support 11 and the phosphor layer 12, while the light-reflecting layer can be omitted. The phosphor layer 12 is composed of a lower layer 12a of phosphor matrix component which is placed on the support (i.e., back side layer) and a upper phosphor layer 12b which is placed on the lower layer 12a.

FIG. 1-(b) also schematically illustrates a section of a portion of another radiation image storage panel prepared by the process of the invention. In FIG. 1-(b), the radiation image storage panel 10 is composed of a support 11, a phosphor layer 12, and a light-reflecting layer 13. The phosphor layer 12 is composed of a lower layer 12a of phosphor matrix component which is placed on the support (i.e., back side layer) and a upper phosphor layer 12b which is placed on the lower layer 12a.

A ratio between the thickness of the lower layer 12a and the thickness of the upper layer 12b generally is in the range of 1:100 to 1:1 (lower layer:upper layer). Each prismatic crystal generally has a diameter (i.e., size of grain boundary) in the range of 0.1 μm to several ten μm, preferably 0.1 to 20 μm. The space between the adjoining prismatic crystals generally is in the range of 0 to several μm.

In the invention, each of the lower layer 12a of matrix component and the upper layer 12b of phosphor composition has prismatic crystals, and the prismatic crystal of the upper layer 12b is just placed on the prismatic crystal of the lower layer 12a. Thus, the prismatic crystals of the phosphor composition in the upper phosphor layer extend just from the prismatic crystals of the lower matrix component layer, to form well grown prismatic crystals of the phosphor composition. Accordingly, the structural deformation or confusion of the prismatic crystals in the phosphor layer is scarcely observed. This means that the phosphor layer produced by the invention is excellent in the structural mottle. In the extended prismatic crystal, the lower portion and upper portion have the same matrix component. This means that the upper portion and lower portion have the essentially same refractive index, and that almost no diffusion and decrease of light energy take place on the interface between the upper portion and lower portion. Accordingly, the radiation image storage panel is favorably employable for reading the stimulated emission from both sides, i.e., from the upper side and lower side.

The activator component and other additives in the upper phosphor layer 12b can migrate into the lower matrix crystal layer on the heated substrate in the course of vapor deposition procedure and/or after the vapor deposition is complete. Accordingly, the interface between the lower matrix crystal portion and the upper phosphor crystal portion may not be evident. However, the gradation of concentration of the activator component remains in the phosphor layer in its depth direction. It is preferred that both of the concentration of the activator component in a portion of from the bottom surface to depth of 99/100 and a concentration of the activator component in a portion of from the upper surface to depth of 1/100 satisfy the condition of $0 \leq p/q < 1$ (preferably $0 \leq p/q < 0.1$), wherein p stands for the concentration in the portion of from the bottom surface to depth of 99/100, and q stands for the concentration in the portion of from the upper surface to depth of 1/100.

The vacuum evaporation or deposition method is not restricted to the electron beam-evaporating method, and various known methods such as resistance-heating method, sputtering method, and CVD method can be used.

The produced phosphor film can be separated from the substrate and then placed on a different substrate.

It is preferred to place a transparent protective film on the surface of the deposited phosphor film, as illustrated in FIG. 1-(a), so as to ensure good handling of the radiation image storage panel in transportation and to avoid deterioration. The protective film preferably is transparent. Further, for protecting the storage panel from chemical deterioration and physical damage, the protective film preferably is chemically stable, physically strong, and of high moisture proof.

The protective film can be provided by coating the stimulable phosphor film with a solution in which an organic polymer (e.g., cellulose derivatives, polymethyl methacrylate, fluororesins soluble in organic solvents) is dissolved in a solvent, by placing a beforehand prepared sheet for the protective film (e.g., a film of organic polymer such as polyethylene terephthalate, a transparent glass plate) on the phosphor film with an adhesive, or by depositing vapor of inorganic compounds on the phosphor film.

Various additives may be dispersed in the protective film. Examples of the additives include light-scattering fine particles (e.g., particles of magnesium oxide, zinc oxide, titanium dioxide and alumina), a slipping agent (e.g., powders of perfluoroolefin resin and silicone resin) and a crosslinking agent (e.g., polyisocyante). The thickness of the protective film generally is in the range of about 0.1 to 20 μm (if the film is made of polymer material) or in the range of about 100 to 1,000 μm (if the film is made of inorganic material such as silicate glass). For enhancing the resistance to stain, a fluororesin layer is preferably provided on the protective film. The fluororesin layer can be form by coating the surface of the protective film with a solution in which a fluororesin is dissolved or dispersed in an organic solvent, and drying the coated solution. The fluororesin may be used singly, but a mixture of the fluororesin and a film-forming resin can be employed. In the mixture, an oligomer having polysiloxane structure or perfluoroalkyl group can be further added. In the fluororesin layer, fine particle filler may be incorporated to reduce blotches caused by interference and to improve the quality of the resultant image. The thickness of the fluororesin layer is generally in the range of 0.5 to 20 μm. For forming the fluororesin layer, additives such as a crosslinking agent, a film-hardening agent and an anti-yellowing agent can be used. In particular, the crosslinking agent is advantageously employed to improve durability of the fluororesin layer.

Thus, a representative radiation image storage panel of the invention can be prepared. The storage panel of the invention may be in known various structures. For example, in order to improve the sharpness of the resultant image, at least one of the films may be colored with a colorant which does not absorb the stimulated emission but the stimulating rays.

The process of the invention for reading radiation image information stored in the above-described radiation image storage panel is explained below by referring to the attached drawings.

Figure 2:
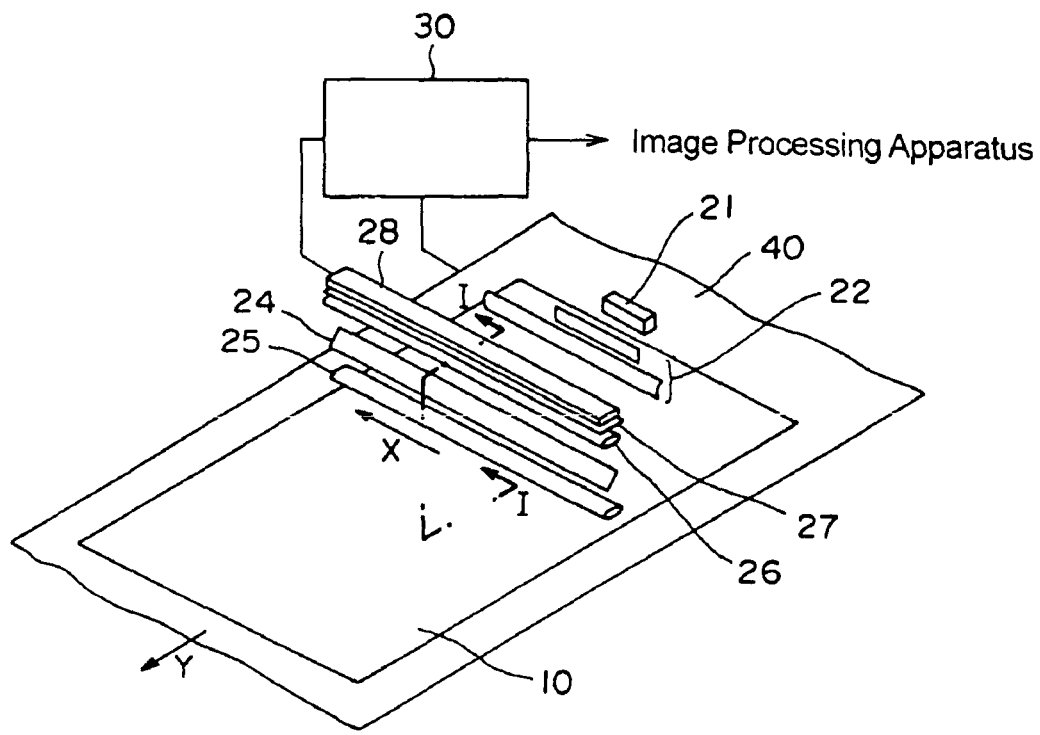
FIG. 2 is a sketch showing a radiation image information-reading apparatus for performing the invention.
Figure 3:
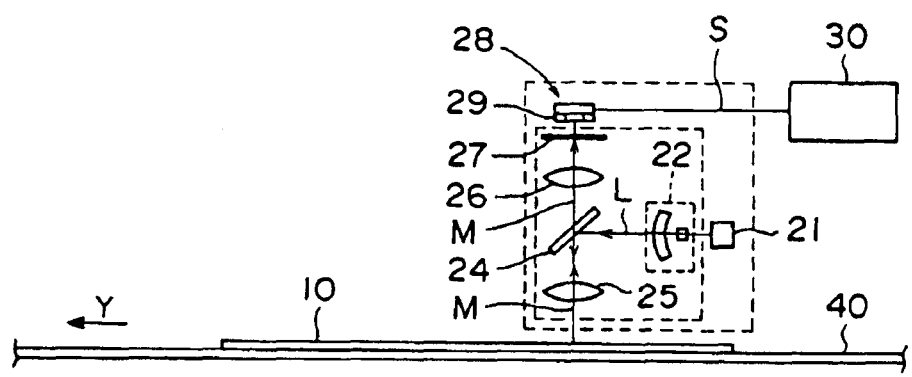
FIG. 3 is a sectional view of the apparatus shown in FIG. 2 taken along the I—I line.

FIG. 2 is a sketch showing a radiation image information-reading apparatus for performing the process of the invention. FIG. 3 is a sectional view of the apparatus of FIG. 2 taken along the I—I line.

In FIGS. 2 and 3, a radiation image panel 10 comprises a support 11 and a phosphor layer 12 in which many prismatic phosphor crystals are perpendicularly aligned. The storage panel 10 is beforehand exposed to radiation (such as X-rays) having passed through an object, and hence radiation image information of the object is recorded and stored in the storage panel 10. In consideration of storing efficiency of the radiation energy, the radiation such as X-rays are preferably applied almost perpendicularly to the storage panel 10 so that the incident direction may be parallel to the aligning direction of the prismatic phosphor crystals 13. The storage panel 10 is placed on the transferring belt 40 so that the phosphor layer 12 would be placed upside. The transferring belt 40 moves in the direction shown by an arrow Y, and thereby the storage panel 10 is transferred. The transferring speed of the storage panel 10 is identical with the moving speed of the belt 40, which is input into an image-reading means 30.

A broad area laser (hereinafter referred to as BLD) 21 linearly emits stimulating light L almost parallel to the surface of the storage panel 10. The stimulating light L passes through an optical system 22 comprising a collimator lens and a toric lens, and is thereby converted into parallel rays. The rays are then reflected by a dichroic mirror 24 placed at an angle of 45° to the panel 10. The dichroic mirror 24 reflects the stimulating rays, but transmits the stimulated emission. The rays reflected by the mirror 24 then advance perpendicularly to the panel 10, and pass through a distributed index lens array (an array of many distributed index lenses, hereinafter referred to as first SELFOC lens array) 25 to be focused on the panel 16 linearly along the direction shown by an arrow X.

The linearly focused stimulating rays L are perpendicularly applied to the storage panel 10, and thereby a stimulated emission M emits from the focused area and from the adjacent area. The emission M has an intensity according to the stored radiation image information. Since the phosphor layer 12 of the storage panel 10 comprises neatly aligned prismatic crystals, most of the stimulated emission M comes out perpendicularly or almost perpendicularly from the surface of the phosphor layer 12 of the storage panel 10.

The stimulated emission M is converted into parallel rays through the first SEUPC lens array 25, and pass through the dichroic mirror 24. The rays M then pass through a second SELFOC lens array 26, and are thereby focused on photo-receiving faces of photoelectric converting elements 29 constituting a line sensor 28 placed just above the area on which the stimulating rays are focused. The line sensor 28 comprises many photoelectric converting elements 29 regularly arrayed in a line having at least the length of the area linearly exposed to the stimulating rays, and each element corresponds to one pixel. Since the line sensor 28 is placed right above the area on which the stimulating rays L are focused, the stimulated emission which almost perpendicularly comes can be efficiently collected. Further, the photo-receiving faces of the converting elements 29 are so small that the light-collecting efficiency is remarkably improved.

The stimulated emission M having passed through the second SELFOC lens array 36 is slightly contaminated with the stimulating rays L reflected by the surface of the panel 10, and hence the contaminating rays L are cut off with a stimulating ray-cutting filter 27. The filter 27 does not transmit the stimulating rays L hut the stimulated emission M.

The stimulated emission M received by the converting elements 29 is photoelectrically converted into signals S, which are then input into the image-reading means 30. In the image-reading means 30, the signals S are processed on the basis of the moving speed of the transferring belt 40 to obtain image data according to the positions of the panel 10. Thus obtained image data are output on an image-processing apparatus (not shown).

The radiation image information-reading apparatus used in the invention is not restricted to the embodiment shown in FIGS. 2 and 3. Each part of the apparatus (such as the light source, the light-collecting optical system between the light source and the storage panel, the line sensor, the optical system between the storage panel and the line sensor) may have various known constitution.

In the above-described embodiment, since the prismatic phosphor crystals in the radiation image storage panel are neatly aligned perpendicularly, the optical systems are designed so that the stimulating rays and the stimulated emission may be enter and come out, respectively, perpendicularly to the panel. However, it is not necessary that the optical systems be set strictly parallel to the aligning direction of the prismatic crystals. Further, in the case where the aligning direction of the prismatic crystals is inclined at a certain angle, the optical systems may be set so that the stimulating rays and the stimulated emission may be enter and come out, respectively, parallel or almost parallel to the inclined aligning direction.

As the line light source, a light source having a linear shape may be used. Further, a fluorescent lamp, a cold cathode fluorescent lamp and a LED (light-emitting diode) array can be also used. The line light source may emit stimulating light either continuously or intermittently in the form of pulses. For reducing possible noises, the stimulating light is preferably in the form of pulses with high power.

Examples of the line sensors include an amorphous silicon sensor, a CCD sensor, a CCD with back illuminator and MOS image sensor. The line sensor way consist of two or three rows of photoelectric converting elements, as well as a single row of the elements.

The radiation image storage panel is preferably transferred almost perpendicularly to the longitudinal direction of the line light source and the line sensor. However, as long as almost all of the surface of the panel is evenly exposed to the stimulating rays, the panel may be transferred diagonally or in zigzag.

In the above-mentioned embodiments, the optical system between the storage panel and the line sensor is designed to form an image isometrically for simplifying the explanation. However, a magnifying or reducing optical system may be used. For increasing the light-collecting efficiency, the use of an isometrical or magnifying optical system is preferred.

Further, the optical path of the stimulating rays L and the stimulated emission M is partly overlapped to reduce the volume of the apparatus. However, the path of the stimulating rays L may be completely different from that of the emission M.

Furthermore, the radiation image information is read out while the radiation image storage panel is transferred. However, the information may be read out while not the storage panel but the line sensor is moved along the surface of the panel, or while both are moved to change their relative positions.

An image-processing apparatus, in which image data signals output from the radiation image information-reading means are subjected to various signal processing, may be installed. Further, an erasing means, in which radiation energy remaining in the panel after reading is adequately released, may be installed.

In the image reading process of the invention, the stimulating rays are applied almost parallel to the aligning direction of the prismatic phosphor crystals in the radiation image storage panel described above, and the stimulated emission is received by the line sensor placed on the side of the upper surface of the phosphor layer and approximately on an extended line of the aligning direction. The stimulating rays are, therefore, efficiently applied onto the prismatic crystals in the phosphor layer, and an increased amount of the stimulated emission coming out of the upper surface parallel to the aligning direction is efficiently received. Accordingly, the image-information can be rapidly read out, and a radiation image of high quality can be reproduced in high sensitivity. The radiation image storage panel and the process of the invention is advantageously used particularly in radiography for medical diagnosis, industrial radiography and fluoroscopy.

The present invention is further described by the following examples.

In the following examples, the water content of a sample was determined in a differential thermogravimetric simultaneous measurement analysis (TG/DTA 320 type, Seiko Electronic Industry Co., Ltd.) by measuring loss of weight of the sample at an increased temperature of room temperature to 300° C. at a temperature increase rate of 10° C./min., in a stream of nitrogen gas (200 cc/min.) according to thermogravimetry. The partial pressure of water ($H_2O$) was determined on the atmospheric gas using a remaining gas analyzer (ass Filter, RGA 300, Stanford Research Systems Incorporated) according to mass spectroscopy. The vacuum level in the evaporation apparatus was measured by means of an ionization vacuum gauge (GI-TL3RY, Japan Vacuum Technology Co., Ltd.)

EXAMPLE 1

(1) Starting Materials

Powdery cesium bromide (CsBr, purity: 4N or higher) and powdery europium bromide ($EuBr_x$, x=2.2, purity: 3N or higher) were employed as the starting materials. The analysis of each starting material by TCP-MS method (iductively coupled plasma spectroscopy—mass spectroscopy) revealed that each of alkali metals other than Cs (Li, Na, K, Rb) and each of alkaline earth metals (Mg, Ca, Sr, Ba) were present in the cesium bromide in amounts of less than 10 ppm and less than 2 ppm, respectively, and each of rare earth elements other than Eu and each of other elements were present in the europium bromide in amounts of less than 20 ppm and less than 10 ppm, respectively.

Since both starting materials were highly hygroscopic, they were stored in a desiccator under dry atmosphere showing a dew point of lower than −20° C., and taken out just before the following preparation was made.

(2) Preparation of CsBr Evaporation Source

The powdery CsBr (31 g) was placed in a powder moulding zirconia die (inner diameter: 25 mm) and compressed in a powder moulding press (Tablepress TB-5 type, NPA System Co., Ltd.) at a pressure of 40 kN, to produce a tablet (diameter: 25 mm, thickness: 15 mm). The pressure applied to the powdery CsBr was approx. 80 mPa. The produced tablet had a density of 4.2 $g/cm^3$, and a water content of 0.6 wt. %.

The tablet was dried in a vacuum drying apparatus at 200° C., for 2 hours. The dried tablet had a water content of 0.3 wt. %.

(3) Preparation of CsBr:Eu Evaporation Source

A powdery CsBr (15 g, 0.07 mol) and a powdery $EuBr_3$ (0.2761 g, $7 \times 10^{-4}$ mol) were mixed in a mixer. The resulting mixture was placed in a quartz boat and placed in the center of an electric furnace. Initially, the furnace was evacuated, and then nitrogen gas was introduced into the furnace until the inner pressure reached an atmospheric pressure. Subsequently, the mixture was fired at 525° C. for one hour. The furnace was then evacuated for 5 minutes, and oxygen was introduced to a pressure of 133 Pa. Further, nitrogen gas was introduced until the inner pressure of the furnace reached an atmospheric pressure, and then the once fired mixture was again fired for one hour. After the firing was complete, the furnace was cooled, while the inner space was kept in vacuo. The resulting CsBr:0.01 Eu phosphor was subjected to compressing in the same manner as in Example 1 to give a tablet. The dried tablet had a density of 4.1 $g/cm^3$ and a water content of 0.4 wt. %.

(4) Formation of Phosphor Film

A synthetic quartz substrate was washed successively with an aqueous alkaline solution, purified water, and isopropyl alcohol, and then mounted to a substrate holder within an evaporation apparatus. In the apparatus, the CsBr tablet and CsBr:Eu tablet were placed in the predetermined sites. Subsequently, the apparatus was evacuated using a combination of a rotary pi, mechanical booster, and turbo molecular pump to reach $1 \times 10^{-3}$ Pa.

In the apparatus, the substrate was kept at room temperature. An electron beam from an electron gun (accelerating voltage: 4.0 kV) was applied onto the CsBr tablet so as to deposit a CsBr matrix layer on the substrate at a rate of 10 μm/min for 4 minutes and 30 seconds. Subsequently, the electron beam was applied to the CsBr:Eu tablet in the same manner, to deposit CsBr:Eu phosphor layer on the CsBr matrix layer for 10 minutes and 30 seconds. The surrounding gas within the evaporation apparatus was analyzed by means of mass spectrometer. The partial pressure of water in the apparatus was $4.0 \times 10^{-3}$ Pa.

After the evaporation-deposition was complete, the inner pressure was returned to atmospheric pressure, and the substrate was taken out of the apparatus. The quartz substrate having the deposited phosphor film was placed on a quartz boat and heated at 200° C. for 2 hours in the center of a tube furnace under nitrogen gas atmosphere. Before and during the heat treatment, the center of the tube furnace was evacuated by means of a rotary pump to reach approx. 10 Pa, so that water adsorbed on the deposited film would be removed. Subsequently, the substrate and the deposited film was cooled in vacuo and thus cooled substrate was then taken out of the tube furnace. On the substrate, a deposited film (thickness: approx. 400 μm, area: 10 cm×10 cm) consisting of prismatic phosphor crystals aligned densely and perpendicularly was formed.

Thus, a radiation image storage panel of the invention having a substrate and a deposited phosphor layer was prepared.

EXAMPLE 2

The procedures of Example 1 were repeated except for heating, in the procedure of formation of phosphor film, the quartz substrate to 200° C. by means of a sheath heater placed on the back side of the substrate, to prepare a radiation image storage panel of the invention.

COMPARISON EXAMPLE 1

The procedures of Example 1 were repeated except for using the CsBr:Eu pellet alone for the vapor evaporation, to prepare a radiation image storage panel for comparison.

EXAMPLE 3

The procedures of Example 1 were repeated except for the following.

The quartz substrate was heated to 200° C. by means of a sheath heater, and then the electron beam was applied to the CsBr tablet at an acceleration voltage of 4.0 kV to deposit CsBr matrix component on the substrate at a rate of 10 μm/min., for 4 minutes and 30 seconds. Subsequently, CsBr and EuBr$_x$ (x=2.2) placed in separate crucibles are placed in the evaporation apparatus, and the electron beam was applied to both materials at an acceleration voltage of 4.0 kV, to deposit simultaneously CsBr at a rate of 5 μm/min. and EuBr at a rate of 0.05 μm/min. for 15 minutes on the previously deposited CsBr matrix layer, to produce a CsBr:Eu phosphor film on the substrate. Thus, there was prepared a radiation image storage panel of the invention.

COMPARISON EXAMPLE 2

The procedures of Example 3 were repeated except for directly depositing CsBr:Eu on the quartz substrate, to prepare a radiation image storage panel for comparison.

[Evaluation of Radiation Image Storage Panel-1]

The prismatic crystalline structure of the phosphor layer of the prepared radiation image storage panels were explained in the following manner.

The phosphor layer and substrate of the radiation image storage panel were simultaneously sectioned in the depth direction. The section was covered with gold (thickness: 300 angstroms) by ion sputtering, to keep it from charge-up. Subsequently, the surface and section of the phosphor layer were observed by means of a scanning electron microscope (JSM-5400, Japan Electron Co., Ltd.).

The results are set forth in FIGS. 4 to 8 (electron microscopic photographs of the sections of radiation image storage panels, ×500).

Figure 4:
FIG. 4 is an electron microscopic photograph taken on the section of the radiation image storage panel of Example 1.

FIG. 4 is a photograph of (100) face of the prismatic crystals of the radiation image storage panel of Example 1.

Figure 5:
FIG. 5 is an electron microscopic photograph taken on the section of the radiation image storage panel of Example 2.

FIG. 5 is a photograph of (110) face of the prismatic crystals of the radiation image storage panel of Example 2.

Figure 6:
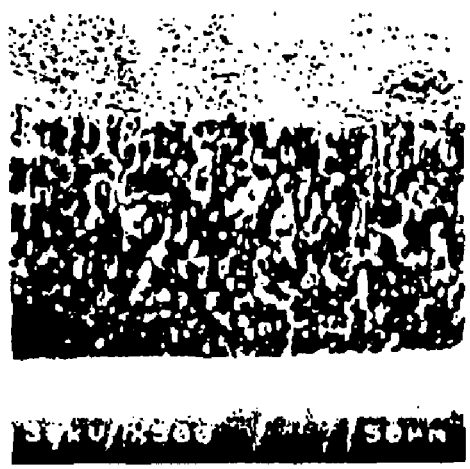
FIG. 6 is an electron microscopic photograph taken on the section of the radiation image storage panel of Comparison Example 1.

FIG. 6 is a photograph of random faces of the prismatic crystals of the radiation image storage panel for Comparison Example 1.

Figure 7:
FIG. 7 is an electron microscopic photograph taken on the section of the radiation image storage panel of Example 3.

FIG. 7 is a photograph of (100) face of the prismatic crystals of the radiation image storage panel of Example 3.

Figure 8:
FIG. 8 is an electron microscopic photograph taken on the section of the radiation image storage panel of Comparison Example 2.

FIG. 8 is a photograph of random faces of the prismatic crystals of the radiation image storage panel for Comparison Example 2.

As is clear from the photographs of FIGS. 4, 5 and 7, the radiation image storage panels prepared by the process of the invention have a phosphor layer composed of well shaped prismatic crystals. Further, He crystal faces are aligned. In contrast, the radiation image storage panels prepared by simply depositing the phosphor material on the substrate have damaged prismatic crystals in the phosphor layer, and the crystal faces are not well aligned, as is seen in FIGS. 6 and 8.

What is claimed is:

1. A process for the preparation of a radiation image storage panel having a phosphor layer which comprises a stimulable phosphor comprising a matrix component and an activator component, which comprises the steps of:

forming on a substrate a lower prismatic crystalline layer consisting essentially of the matrix component by vapor deposition; and forming on the lower prismatic crystalline layer an upper prismatic crystalline layer comprising the matrix component and the activator component by vapor deposition, under the conditions that a ratio of thickness between the lower prismatic crystalline layer and the upper prismatic crystalline layer would be in the range of 1:100 to 1:1, and that a concentration of the activator component in a portion of from a bottom surface of the lower prismatic crystalline layer to depth of 99/100 based on a total depth of the lower and upper prismatic crystalline layers and a concentration of the activator component in a portion of from the upper surface of the upper prismatic crystalline layer to depth of 1/100 based on the total depth of the lower and upper prismatic crystalline layers satisfy the condition of 0≦p/q<0.1, wherein p stands for the concentration in the portion of from the bottom surface to depth of 99/100, and q stands for the concentration in the portion of from the upper surface to depth of 1/100.

2. The process of claim 1, wherein the lower prismatic crystalline layer and upper prismatic crystalline layer are simultaneously subjected to heat treatment.

3. The process of claim 1, wherein the stimulable phosphor is an alkali metal halide phosphor having the formula (I):

$$M^I X \cdot x M^{II} X'_2 \cdot y M^{III} X''_3 : z A \qquad (I)$$

in which $M^I$ is at least one alkali metal element selected from the group consisting of Li, Na, K, Rb and Cs; $M^{II}$ is at least one alkaline earth metal element or divalent metal element selected from the group consisting of Be, Mg, Ca, Sr, Ba, Ni, Cu, Zn and Cd; $M^{III}$ is at least one rare earth element or trivalent metal element selected from the group consisting of Sc, Y, La, Ce, Pr, Nd, Pm, Sm, Eu, Gd, Tb, Dy, Ho, Er, Tm, Yb, Lu, Al, Ga and In; each of X, X' and X" independently is at least one halogen selected from the group consisting of F, Cl, Br and I; A is at least one rare earth element or metal element selected from the group consisting of Y, Ce, Pr, Nd, Sm, Eu, Gd, Tb, Dy, Ho, Er, Tm, Yb, Lu, Na, Mg, Cu, Ag, Tl and Bi; and x, y and z are numbers satisfying the conditions of $0 \leqq x < 0.5$, $0 \leqq y < 0.5$ and $0 < z \leqq 0.2$, respectively.

4. The process of claim 3, wherein A is Eu.

5. The process of claim 3, wherein $M^I$ is Cs, and X is Br.

6. A radiation image storage panel having a substrate, a lower prismatic crystalline layer consisting essentially of a matrix component of a stimulable phosphor and an upper prismatic crystalline layer comprising the matrix component and an activator component, wherein a ratio of thickness between the lower prismatic crystalline layer and the upper prismatic crystalline layer would be in the range of 1:100 to 1:1, and a concentration of the activator component in a portion of from the bottom surface of the lower prismatic crystalline layer to depth of 99/100 based on a total death of the lower and upper prismatic crystalline layers and a concentration of the activator component in a portion of from the upper surface of the upper prismatic crystalline layer to depth of 1/100 based on the total death of the lower and upper prismatic crystalline layers satisfy the condition of $0 \leqq p/q < 0.1$, wherein p stands for the concentration in the portion of from the bottom surface to depth of 99/100, and q stands for the concentration in the portion of from the upper surface to depth of 1/100.

7. The radiation image storage panel of claim 6, wherein a transparent support is attached to the bottom surface of the phosphor layer and a protective film is attached to the upper surface of the phosphor layer.

8. A process for reading radiation image information comprising steps of:

moving in one direction a radiation image storage panel of claim 6 on which radiation image information is recorded and stored, in relation to a line sensor which comprises plural photoelectric converting elements arranged linearly and which is placed over the surface of the phosphor layer of the storage panel, under such condition that the line sensor moves on a plane parallel to the storage panel, while the phosphor layer of the storage panel is scanned with stimulating rays in a direction which is different from the direction of the movement of the storage panel;

detecting an emission emitted from the phosphor layer of the storage panel by the line sensor, so as to photoelectrically convert the emission to an electric signal;

detecting an electric signal of the movement of the storage panel in relation to the line sensor; and comparing the signal of the emission and the signal of the movement of the storage panel to produce a radiation image information in the form of electric signals.

* * * * *